United States Patent
Kuroda (10) Patent No.: US 7,479,848 B2
(45) Date of Patent: Jan. 20, 2009

(54) ACOUSTIC WAVE FILTER DEVICE (75) Inventor: Katsuhito Kuroda, Hakusa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/055,414

(22) Filed: Mar. 26, 2008

(65) Prior Publication Data
US 2008/0169886 A1    Jul. 17, 2008

Related U.S. Application Data

(63) Continuation of application No. PCT/JP2006/320920, filed on Oct. 20, 2006.

(30) Foreign Application Priority Data
Nov. 1, 2005  (JP) .............................. 2005-318414

(51) Int. Cl.
*H03H 9/00* (2006.01)
*H03H 9/54* (2006.01)
*H01L 41/08* (2006.01)

(52) U.S. Cl. ........................ 333/133; 333/186; 333/189

(58) Field of Classification Search ................. 333/133, 333/186, 187, 189, 190, 191, 192, 193, 197
See application file for complete search history.

(56) References Cited

U.S. PATENT DOCUMENTS 6,404,302 B1   6/2002   Satoh et al.
7,084,718 B2 *  8/2006   Nakamura et al. .......... 333/133
7,138,888 B2 * 11/2006   Yamakawa et al. .......... 333/133
2004/0051601 A1   3/2004   Frank
2005/0099244 A1   5/2005   Nakamura et al.

FOREIGN PATENT DOCUMENTS

JP    10-065489 A    3/1998
JP    2003/332881 A    11/2003

OTHER PUBLICATIONS

Official communication issued in counterpart International Application No. PCT/JP2006/320920, mailed on Feb. 6, 2006.

* cited by examiner

Primary Examiner—Dean O Takaoka
(74) Attorney, Agent, or Firm—Keating & Bennett, LLP (57) ABSTRACT

In an acoustic wave filter device, a first filter circuit portion includes a first inductor provided in a series arm that couples an input terminal and an output terminal is serially connected to a first acoustic wave resonator, and a second filter circuit portion includes a second inductor provided in the series arm and second and third acoustic wave resonators and connected between one end and the other end of the second inductor and a ground potential. When the pass band center frequency is set as a first center frequency and the center frequency of a filter defined by the inductance of the first and second inductors and the capacitance of the first to third acoustic wave resonators is set as a second center frequency f2, f1 is less than f2.

7 Claims, 8 Drawing Sheets

ACOUSTIC WAVE FILTER DEVICE

BACKGROUND OF THE INVENTION

1. Field of the Invention

The present invention relates to acoustic wave filter devices, such as surface acoustic wave filter devices and boundary acoustic wave filter devices. More specifically, the present invention relates to an acoustic wave filter device in which a plurality of inductors are connected between an input terminal and an output terminal and in which a plurality of resonators are connected between a series arm coupling the input terminal and output terminal and the ground potential.

2. Description of the Related Art

Conventionally, various surface acoustic wave filter devices are used as trap filters in RF stages of communication apparatuses, such as mobile phones. For example, Japanese Unexamined Patent Application Publication No. 2004-129238 discloses a trap filter including a plurality of inductances serially connected between an input terminal and an output terminal and parallel arm resonators each connected between the input terminal and the ground potential, between the output terminal and the ground potential, and between a node of adjacent inductances and the ground potential.

Figure 12:
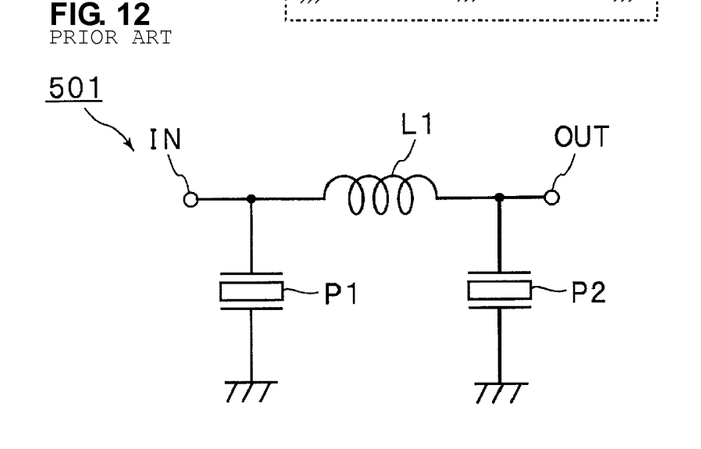
FIG. 12 is a circuit diagram illustrating an example of a conventional surface acoustic wave filter device.

FIG. 12 is a circuit diagram illustrating a circuit configuration of the trap filter mentioned above. In a trap filter 501, an inductance L1 is connected between an input terminal IN and an output terminal OUT. A parallel arm resonator P1 is connected between the input terminal IN and a ground potential. In addition, a parallel arm resonator P2 is connected between the output terminal OUT and the ground potential. In this filter, each of the parallel arm resonators P1 and P2 is defined by a surface acoustic wave resonator in which an IDT electrode is disposed on a piezoelectric substrate. In addition, the resonant frequencies of the parallel arm resonators P1 and P2 are set to be substantially equal and located in a stop band.

On the other hand, Japanese Unexamined Patent Application Publication No. 2003-332881 discloses a surface acoustic wave filter device in which first one-terminal-pair surface acoustic wave resonators having a predetermined anti-resonant frequency are connected to a series arm coupling an input terminal and an output terminal, and a second one-terminal-pair surface acoustic wave resonator is connected between first ends of the first one-terminal-pair boundary acoustic wave resonators and a ground potential. In this filter, the resonant frequency of the second one-terminal-pair surface acoustic wave resonator is set to be substantially equal to the anti-resonant frequency of the first one-terminal-pair surface acoustic wave resonators, and as a result, a trap providing a large amount of attenuation is formed.

In the trap filter 501 disclosed in Japanese Unexamined Patent Application Publication No. 2004-129238, the inductance L1 and the parallel arm resonators P1 and P2 define a stop band, i.e., a trap. However, the attenuation characteristic in a frequency band lower than the trap is flat, and thus, characteristics as a band-pass filter cannot be obtained on the lower frequency side.

Also in the surface acoustic wave filter device disclosed in Japanese Unexamined Patent Application Publication No. 2003-332881, a trap is provided by setting the anti-resonant frequency of the first one-terminal-pair surface acoustic wave resonators and the resonant frequency of the second one-terminal-pair surface acoustic wave resonator to be substantially equal, as described above. In this case, a characteristic as a trap filter is obtained by series resonance of the inductors serially connected with the first one-terminal-pair surface acoustic wave resonators and capacitance of the one-terminal-pair surface acoustic wave resonators. However, in the characteristic as a trap filter, the width of the passband is relatively small on the frequency side lower than the trap.

On the other hand, in mobile phones equipped with recording functions of ground-wave digital television DVB-H, a pass band with a sufficiently broad band width on the frequency side lower than the trap is required in order to enable recording during transmission. However, with the trap filters disclosed in Japanese Unexamined Patent Application Publication No. 2004-129238 and in Japanese Unexamined Patent Application Publication No. 2003-332881, as described above, it is difficult to provide a pass band having a sufficient band width on the frequency side lower than the trap.

SUMMARY OF THE INVENTION

To overcome the problems described above, preferred embodiments of the present invention provide an acoustic wave filter device which has a circuit configuration in which an acoustic wave resonator and an inductor facilitate downsizing, and which cannot only provide a trap providing a sufficient amount of attenuation, but also provide a pass band having a sufficient band width on the frequency side lower than the trap.

Preferred embodiments of the present invention provide an acoustic wave filter device having a first attenuation band, a pass band which is located on the frequency side lower than the first attenuation band and has a first center frequency, and a second attenuation band which is located on the frequency side higher than the first attenuation band. The acoustic wave filter device includes first filter circuit portions having first inductors provided in a series arm coupling an input terminal and an output terminal and first acoustic wave resonators serially connected to the first inductors, and a second filter circuit portion having at least one second inductor provided in the series arm, a second acoustic wave resonator connected between one end of the second inductor and a ground potential, and a third acoustic wave resonator connected between the other end of the second inductor and the ground potential. In the acoustic wave filter device, the first filter circuit portions and the second filter circuit portion are serially connected in the series arm, and when the center frequency of a frequency characteristic of an LC filter formed by capacitance components of the first to third acoustic wave resonators and inductance components of the first and second inductors is set as a second center frequency, the second center frequency is set to be higher than the first frequency.

Preferably, the first filter circuit portion is connected to both the input side and output side of the second filter circuit portion.

Preferably, a plurality of second inductors are provided in the second filter circuit portion, and the second acoustic wave resonator connected to one end of one of the second inductors and the third acoustic wave resonator connected to the other end of the other one of the second inductors are disposed between the adjacent second inductors.

Preferably, the second center frequency is located at the high frequency side end of the pass band.

Preferably, an anti-resonant frequency of the first acoustic wave resonators and a resonant frequency of the second acoustic wave resonator are different from each other.

Preferably, the first and second inductors are defined by a chip-type inductance component.

Preferably, an acoustic wave filter chip is provided which includes a piezoelectric substrate having the first, second and third acoustic wave resonators provided thereon and a mounting substrate having the acoustic wave filter chip mounted thereon. In the acoustic wave filter device, the first and second inductors are built in the mounting substrate.

With an acoustic wave filter device according to preferred embodiments of the present invention, first filter circuit portions include first inductors provided in a series arm coupling an input terminal and an output terminal and first acoustic wave resonators serially connected to the first inductors, and a second filter circuit portion includes at least one second inductor provided in the series arm, a second acoustic wave resonator connected between one end of the second inductor and a ground potential, and a third acoustic wave resonator connected between the other end of the second inductor and the ground potential. The first filter circuit portions and the second filter circuit portion are connected in series. Thus, by determining frequency characteristics of the first acoustic wave resonators provided in the series arm and the second and third acoustic wave resonators, a first attenuation band as a trap providing a large amount of attenuation can be obtained.

In addition, in the low frequency side of the first attenuation band, an LC filter is provided by capacitance components of the first to third acoustic wave resonators and inductance components of the first and second inductors, and the second center frequency of the frequency characteristic of the LC filter is set to be higher than the first center frequency which is the center frequency of the pass band located on the frequency side lower than the first attenuation band. Therefore, the amount of attenuation in a portion adjacent to the stop band in the high frequency side of the pass band is sufficiently small, and thus, the band width can be sufficiently expanded. Accordingly, a pass band having a sufficient band width is securely provided on the frequency side lower than the trap. Therefore, for example, an acoustic wave filter device preferable as a band-pass filter for performing recording during transmission can be provided in a mobile phone provided with a recording function for the ground-wave digital television broadcasting.

When the first filter circuit portions are connected to both the input side and output side of the second filter circuit portion, this enables the amount of attenuation in the first and second attenuation bands to be further increased.

A plurality of the second inductors may be provided in the second filter circuit portion. In this case, the third acoustic wave resonator connected in the one end of one of the second inductors and the third acoustic wave resonator connected to the other end of the second inductors may be incorporated between the adjacent second inductors. In this case, the number of components can be reduced, and due to the multi-stage configuration of the second filter circuit portion, the amount of attenuation in the first and second attenuation bands can be further increased.

When the second center frequency is located at the high frequency side end of the pass band, the amount of attenuation at the second center frequency is sufficiently small, and thus, the amount of attenuation at the high frequency side of the pass band can be sufficiently decreased. Therefore, the pass band width can be more effectively expanded.

When the anti-resonant frequency of the first acoustic wave resonators and the resonant frequency of the second acoustic wave resonator are different from each other, the width of the second attenuation band can be expanded.

When the first and second inductors are defined by a chip-type inductance component, the first and second inductors can be surface-mounted on a mounting substrate, which facilitates downsizing of the acoustic wave filter device.

When an acoustic wave filter chip including a single piezoelectric substrate having the first to third acoustic wave resonators provided thereon and a mounting substrate having the acoustic wave filter chip mounted thereon are further included, and the first and second inductors are built in the mounting substrate, no external components defining the first and second inductors are required. Accordingly, further downsizing of the acoustic wave filter device can be facilitated and the reduction of the number of components can be achieved.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

The present invention will be described in detailed preferred embodiments of the present invention with reference to the drawings.

Figure 1:
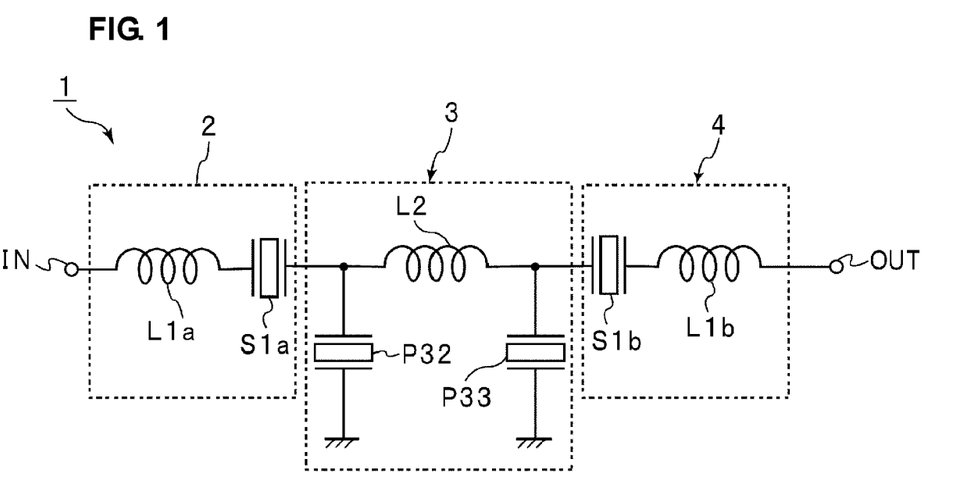
FIG. 1 is a circuit diagram illustrating a circuit configuration of a surface acoustic wave filter device according to a preferred embodiment of the present invention.

FIG. 1 is a circuit diagram of a surface acoustic wave filter device according to a preferred embodiment of the present invention. A surface acoustic wave filter device 1 of the present preferred embodiment is preferably used, for example, as a trap filter used in an RF stage of a mobile phone provided with a recording function for ground-wave digital television broadcasting. The surface acoustic wave filter device 1 preferably is configured to have a trap band around 880-915 MHz and a pass band including a frequency band around 470-750 MHz of ground-wave digital television DVB-H in a frequency range below about 800 MHz. The center frequency of the pass band is set as a first center frequency. The surface acoustic wave filter device 1 also has a second attenuation band on the frequency side higher than the first attenuation band set as the trap band, i.e., in a frequency range of about 1300 MHz and higher, for example.

As illustrated in FIG. 1, in the surface acoustic wave filter device 1, a first filter circuit portion 2, a second filter circuit portion 3 and a first filter circuit portion 4 are serially connected in that order between an input terminal IN and an output terminal OUT. The first filter circuit portion 2 includes the input terminal IN, a first inductor L1a provided in a series arm coupling the input terminal IN and the output terminal OUT, and a first acoustic wave resonator S1a serially connected to the first inductor L1a.

The second filter circuit portion 3 includes at least one second inductor L2 provided in the series arm, a second acoustic wave resonator P32 connected between one end of the second inductor L2 and a ground potential, and a third acoustic wave resonator P33 connected between the other end of the second inductor L2 and the ground potential.

The first filter circuit portion 4 includes a first inductor L1b provided in the series arm and a first acoustic wave resonator S1b serially connected to the first inductor L1b.

In the acoustic wave filter device of the present preferred embodiment, a serial resonance circuit is defined by capacitance components of the first acoustic wave resonators S1a and S1b and the first inductors L1a and L1b, and a phase-shift circuit is defined by capacitance components of the second and third acoustic wave resonators arranged in parallel arms and the second inductor L2 in the series arm. With this arrangement of the above serial resonance circuit and the phase-shift circuit, a band-pass type filter characteristic with a pass band can be obtained. Specifically, an LC filter is defined by the capacitance components of the first to third acoustic wave resonators S1a, S1b, P32, and P33 and inductance components of the first and second inductors L1a, L1b, and L2. When the center frequency of the pass band located on the frequency side lower than the first attenuation band as the trap band is set as a first center frequency, a second center frequency which is the center frequency of the LC filter is set to be higher than the first center frequency. With this arrangement, the band width of the pass band is expanded. This will be described in more detail below.

Figure 2:
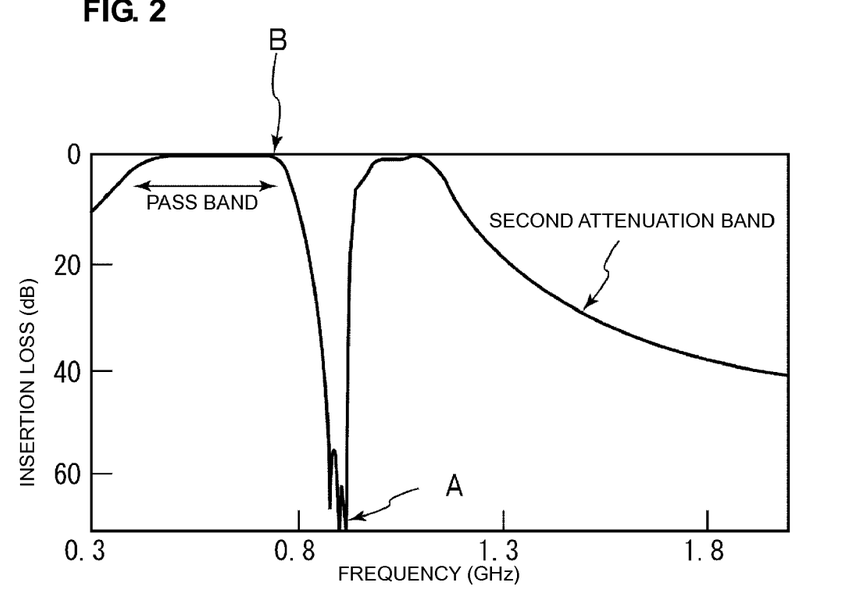
FIG. 2 is a diagram illustrating an attenuation-frequency characteristic of the surface acoustic wave filter device in the preferred embodiment illustrated in FIG. 1.

FIG. 2 shows an attenuation-frequency characteristic of a surface acoustic wave filter device according to the present preferred embodiment. The anti-resonant frequency of the acoustic wave resonators S1a and S1b are set to be substantially identical to the resonant frequency of the second and third acoustic wave resonators P32 and P33 arranged in the parallel arms. Thus, an attenuation trap indicated by an arrow A is formed. The trap A has a relatively small width and a large amount of attenuation.

Figure 6:
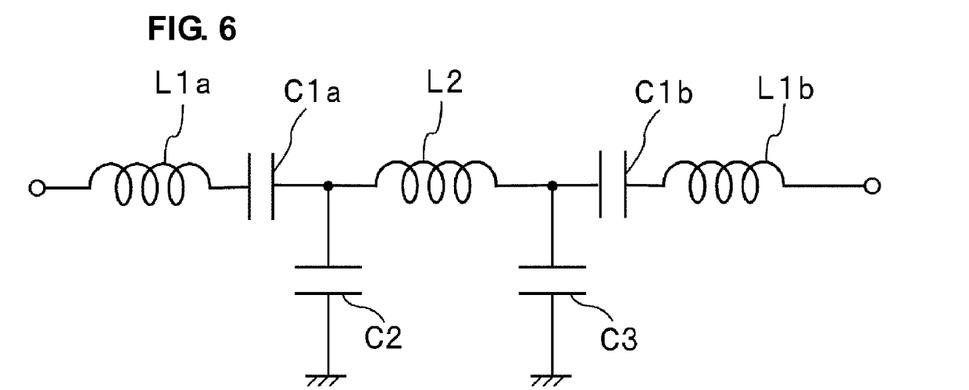
FIG. 6 is a circuit diagram illustrating a circuit obtained when the acoustic wave resonators in the preferred embodiment illustrated in FIG. 1 is replaced with capacitance elements.
Figure 7:
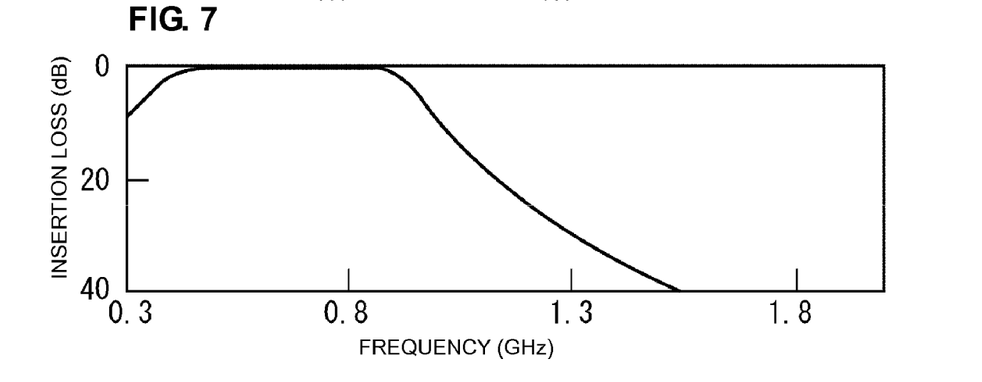
FIG. 7 is a diagram illustrating an attenuation-frequency characteristic of the circuit illustrated in FIG. 6.

On the other hand, while the amount of attenuation is set to be small at both sides of the trap A, the low frequency side of the trap A is set as the pass band in the acoustic wave filter device 1 of the present preferred embodiment. As described above, this pass band is utilizes the filter characteristic provided by the serial resonance circuit and the phase-shift circuit each defined by the capacitance components of the acoustic wave resonators and the inductors. Specifically, when the acoustic wave resonators in the surface acoustic wave filter device 1 illustrated in FIG. 1 are all replaced with capacitive elements, a circuit illustrated in FIG. 6 is obtained. Capacitive elements C1a and C1b are arranged in the series arm in place of the acoustic wave resonators S1a and S1b, and capacitive elements C2 and C3 are arranged in the parallel arms in place of the acoustic wave resonators P32 and P33. The attenuation-frequency characteristic of the circuit illustrated in FIG. 6 is illustrated in FIG. 7. Specifically, an LC filter circuit is defined by the capacitance of the capacitive elements C1a, C1b, C2, and C3 and the inductance of the inductors L1a, L2, and L1b arranged in the series arm. The frequency characteristic of the filter circuit is illustrated in FIG. 7.

Thus, by replacing the capacitive elements C1a, C1b, C2, and C3 with the acoustic wave resonators S1a, S1b, P32, and P33, the characteristic illustrated in FIG. 2 is obtained.

In the present preferred embodiment, the amount of attenuation at the trap A as the first attenuation band is set to be sufficiently large. Further, the pass band having a sufficient band width is provided on the frequency side lower than the trap A, and the second attenuation band is provided on frequency side higher than the trap A. This will be described in more detail below.

In the present preferred embodiment, the center frequency of the LC filter defined by the capacitance components and the inductance components as described above is set as a second center frequency f2, and the center frequency of the pass band provided on the frequency side lower than the trap A of the surface acoustic wave filter device 1 is set as a first center frequency f1, f2 is higher than f1. Thus, the amount of attenuation at a portion indicated by an arrow B in FIG. 2, i.e., near the high end of the pass band of the surface acoustic wave filter device 1, is sufficiently small. In the other words, the amount of attenuation near the high end of the pass band is sufficiently small, and the pass band is sufficiently expanded on the high frequency side.

In addition, in order to broaden the band width of the LC filter to reduce insertion loss and to broaden the band width of the pass band in its lower frequency side, which is provided at the low frequency side of the trap A, it is necessary to decrease the inductance value of the first inductors L1a and L1b in the first filter circuit portion and increase the capacitance of the acoustic wave resonators S1a and S1b. Thus, the inductance value of the inductors L1a and L1b are decreased, which decreases the resistance. In addition, when the capacitance of the first acoustic wave resonators S1a and S1b is increased, the Q value is increased. Therefore, the insertion loss can be further reduced.

Thus, according to the present preferred embodiment, not only can the width of the pass band be expanded, the insertion loss can also be further reduced. Accordingly, a trap and a pass band with low insertion loss and a broad band width can be provided at the frequency side lower than the trap.

Now, a specific experimental example will be described.

The specifications of the first acoustic wave resonators S1a, S1b, and the second and third acoustic wave resonators P32 and P33 are shown in Table 1 below. The inductance value of the first inductors L1a and the L1b is preferably set to about 27 nH, and the inductance value of the second inductor L2 is set to about 24 nH, for example. In this case, the frequency characteristic of the surface acoustic wave filter device 1 is as illustrated in FIG. 2.

TABLE 1

| | Resonant frequency fs [MHz] | parallel capacitance C0 [pF] | series capacitance C1 [pF] | series inductance L [nH] | resonator resistance Rs [Ω] | anti-resonant frequency fp [MHz] |
| --- | --- | --- | --- | --- | --- | --- |
| S1a | 875.1 | 2.10 | 0.26 | 129 | 1.81 | 927.7 |
| P32 | 915.7 | 2.60 | 0.32 | 94 | 1.72 | 970.4 |
| P33 | 873.9 | 2.66 | 0.33 | 100 | 1.84 | 926.5 |
| S1b | 852.4 | 2.06 | 0.25 | 138 | 1.91 | 902.6 |

In this example, the amount of attenuation at the trap A at around 880-915 MHz is as large as about 55 dB. In addition, a pass band was provided on the frequency side lower than the trap A. Note that the band width of a pass band refers to the width of a band in which the amount of attenuation is equal to or less than about 3 dB. The band width of the pass band was about 380 MHz. Therefore, low insertion loss can be achieved at about 470-750 MHz.

In addition, on the frequency side higher than the trap A, a second attenuation band was provided in a frequency range of about 1500-2000 MHz.

Figure 8:
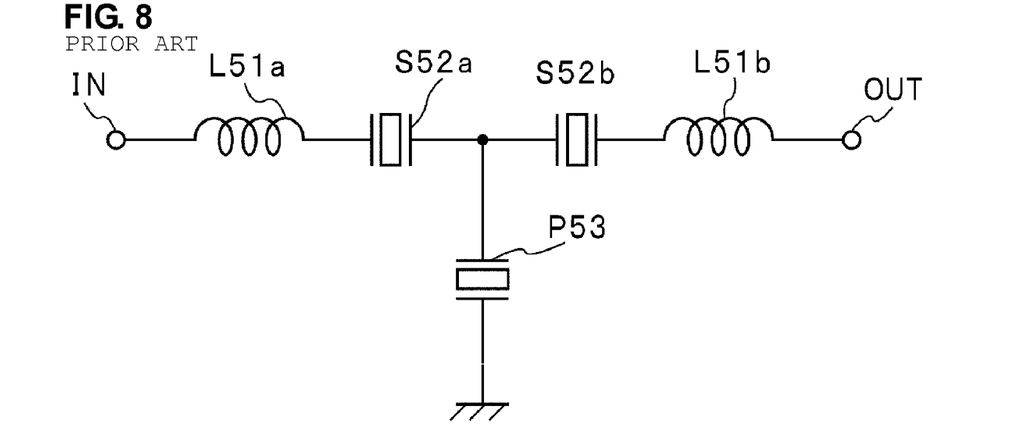
FIG. 8 is a circuit diagram illustrating an example of a circuit configuration of a conventional surface acoustic wave filter device.

For comparison, a filter circuit illustrated in FIG. 8 was prepared. In this filter circuit, an inductor L51a, acoustic wave resonators S52a and S52b, and an inductor L51b are connected in that order between an input terminal IN and an output terminal OUT, and a acoustic wave resonator P53 is provided in a parallel arm connecting the node between the acoustic wave resonators S52a and S52b and a ground potential. That is, this filter circuit is fabricated in accordance with the circuit configuration disclosed in Japanese Unexamined Patent Application Publication No. 2003-332881 described above. The specifications of the acoustic wave resonators S52a, S52b, and P53 in the surface acoustic wave filter device of this comparative example are shown in Table 2. The inductance value of the inductor L51a is set to about 22 nH, and the inductance value of the inductor L51b is set to about 23 nH.

The specifications shown in Table 2 and the above inductance values were selected so that a trap was formed at around 880-915 MHz and a pass band was formed around 470-750 MHz, similarly to the above-described preferred embodiment.

A frequency characteristic of the surface acoustic wave filter device of the conventional example fabricated as described above is shown in FIG. 9.

Figure 9:
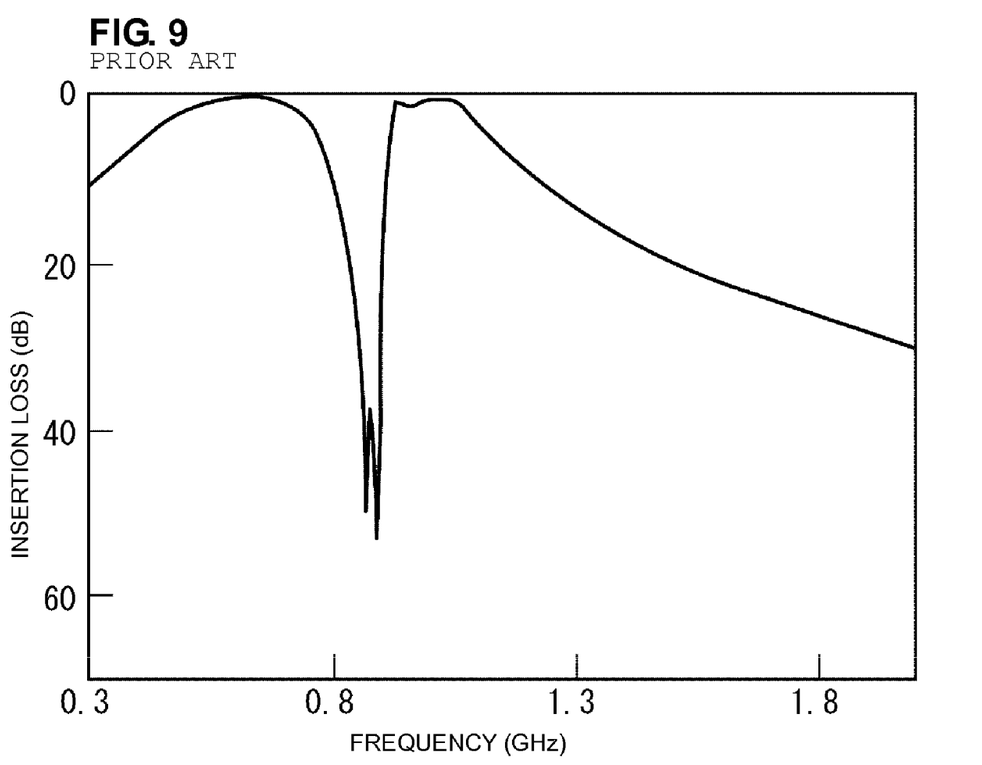
FIG. 9 is a diagram illustrating an attenuation-frequency characteristic of the surface acoustic wave filter device illustrated in FIG. 8.

As shown in FIG. 9, the amount of attenuation near each end of the pass band around 470 MHz and around 750 MHz was greater than about 3 dB. Thus, the band width of a frequency range with about 3 dB attenuation amount was not more than about 270 MHz. This presents a problem in that the insertion loss is large at around the high and low ends of the frequency band about 470-750 MHz of the ground digital television DVB-H.

As is apparent from the comparison of FIG. 2 and FIG. 9, according to the above-described preferred embodiment, a pass band with low loss and a broad band width can be provided on the frequency side lower than the trap.

Figure 11:
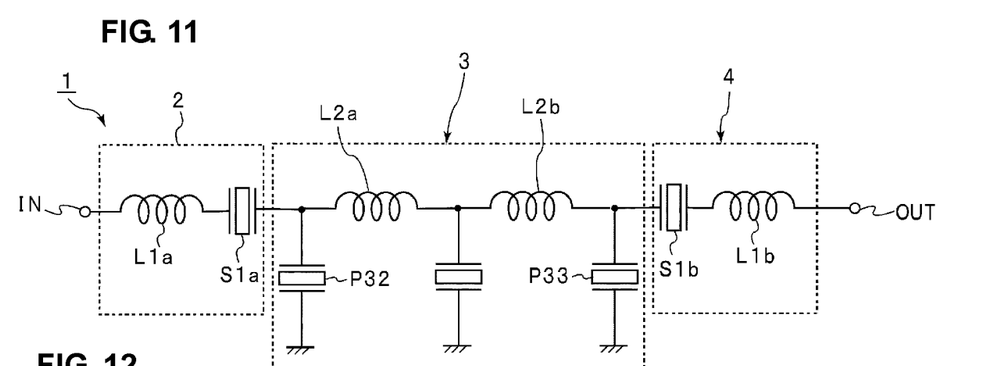
FIG. 11 is a circuit diagram of a modified example of the preferred embodiment illustrated in FIG. 1.

While in the second filter circuit portion 3, the single second inductor L2 is connected, it is also possible for a plurality of second inductors L2a and L2b to be connected in the series arm in the second filter circuit portion. In this case, between the adjacent second inductors L2a and L2b, the second acoustic wave resonator connected to one end of the inductor L2b and the third acoustic wave resonator connected to the other end of the second inductor L2a may be included. This reduces the number of parts. At the same time, the amount of attenuation at the first and second attenuation bands can be increased due to the multi-stage configuration of the second filter circuit portion.

Now, an example of the detailed structure of the surface acoustic wave filter device according to the above-described preferred embodiment will be provided.

Figure 3:
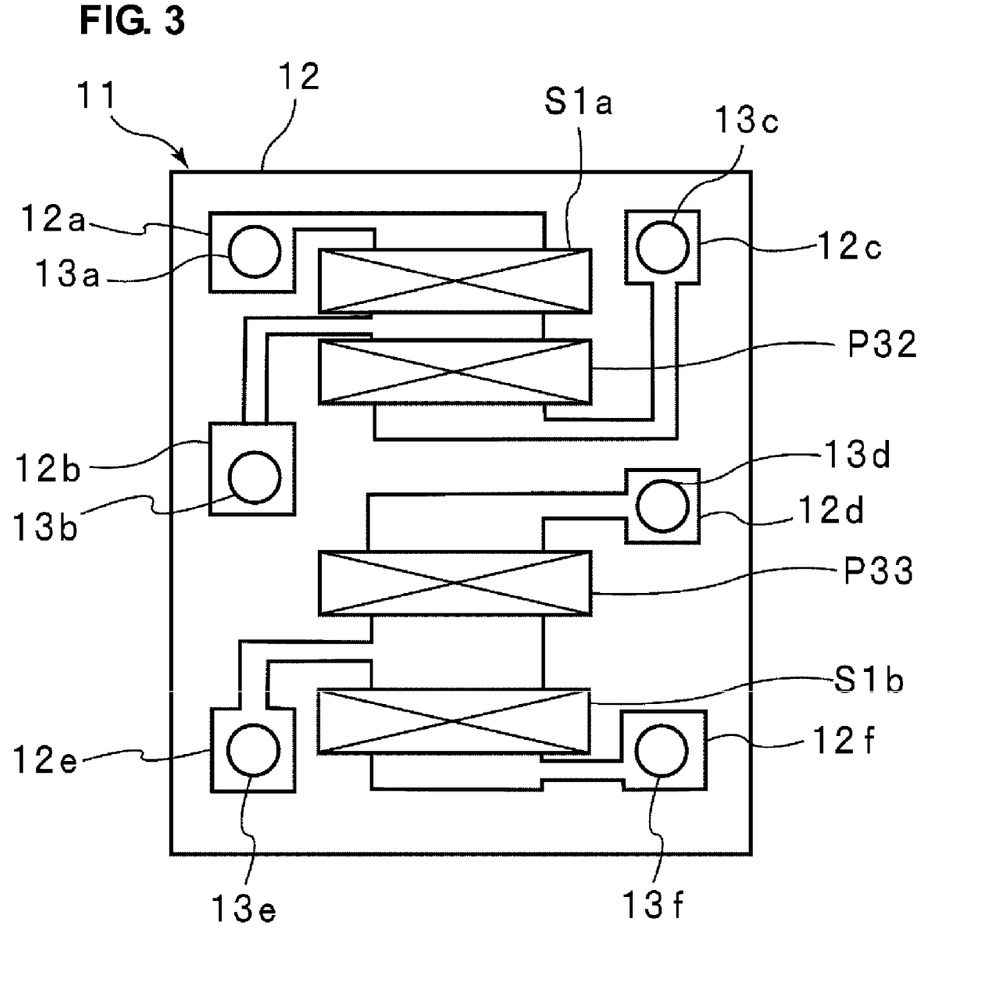
FIG. 3 is a schematic plan view of a piezoelectric substrate, illustrating an electrode structure on the lower surface of the piezoelectric substrate of a surface acoustic wave filter chip used in the surface acoustic wave filter device in the preferred embodiment illustrated in FIG. 1.

FIG. 3 is a schematic plan view illustrating a surface acoustic wave filter chip 11 used in the surface acoustic wave filter device 1 of the present preferred embodiment. This surface acoustic wave filter chip 11 preferably includes a substantially rectangular piezoelectric substrate 12. In FIG. 3, while the piezoelectric substrate 12 is illustrated in a schematic plan view, electrodes provided below the piezoelectric substrate 12 are perspectively illustrated. This is because the piezoelectric substrate 12 is mounted on a package substrate 14 illustrated in FIG. 4A with its orientation as illustrated in the FIG. 4A, such that the main components of the surface acoustic

TABLE 2

Figure 5A:
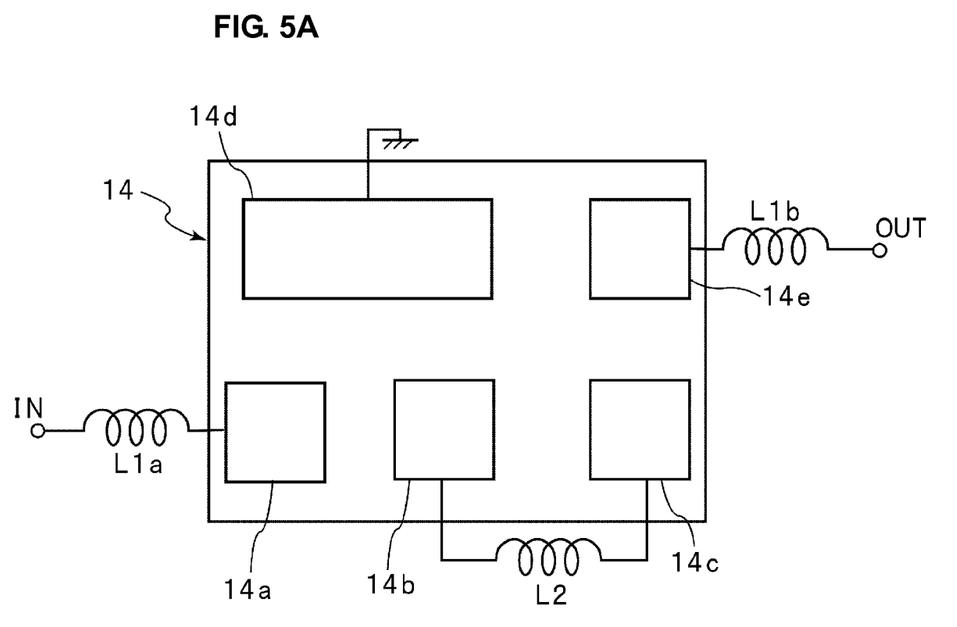
FIG. 5A is a schematic block diagram illustrating the relationship between electrode lands disposed on a package of the surface acoustic wave filter device in the preferred embodiment illustrated in FIG. 1 and external inductance components.
Figure 5B:
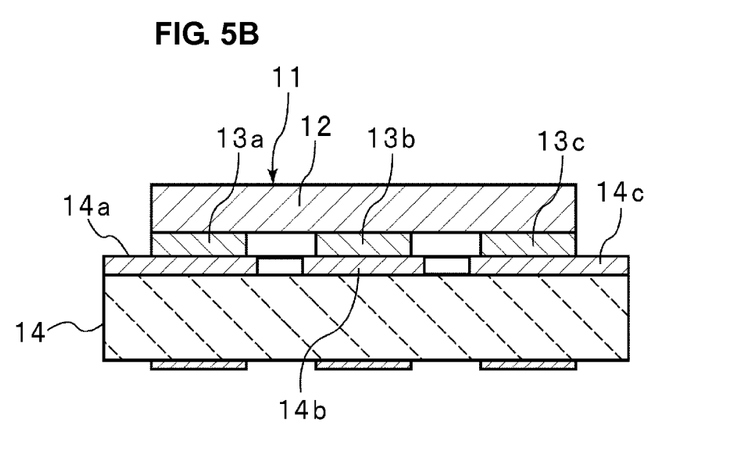
FIG. 5B is a schematic elevational cross-sectional view illustrating main components of the surface acoustic wave filter device in the present preferred embodiment.

| | resonant frequency fs [MHz] | parallel capacitance C0 [pF] | series capacitance C1 [pF] | series inductance L [nH] | resonator resistance Rs [Ω] | anti-resonant frequency fp [MHz] |
| --- | --- | --- | --- | --- | --- | --- |
| S52a | 833.4 | 3.22 | 0.46 | 79 | 1.00 | 890.9 |
| P53 | 865.1 | 4.20 | 0.60 | 57 | 1.00 | 924.8 |
| S52b | 840.6 | 3.06 | 0.44 | 82 | 1.00 | 899.0 | wave filter device 1 illustrated in a schematic cross-sectional view in FIG. 5B are configured.

As illustrated in FIG. 3, on the lower surface of the piezoelectric substrate 12, the first acoustic wave resonators S1a and S1b and the second and third acoustic wave resonators P32 and P33 are provided. Each of the acoustic wave resonators is defined by a one-terminal-pair surface acoustic wave resonator having an IDT electrode and reflectors arranged at opposite sides of the IDT electrode in the surface acoustic wave propagation direction. In FIG. 3, these electrodes are not specifically illustrated, and portions on which IDT electrodes and pairs of reflectors are arranged are schematically illustrated.

Figure 4A:
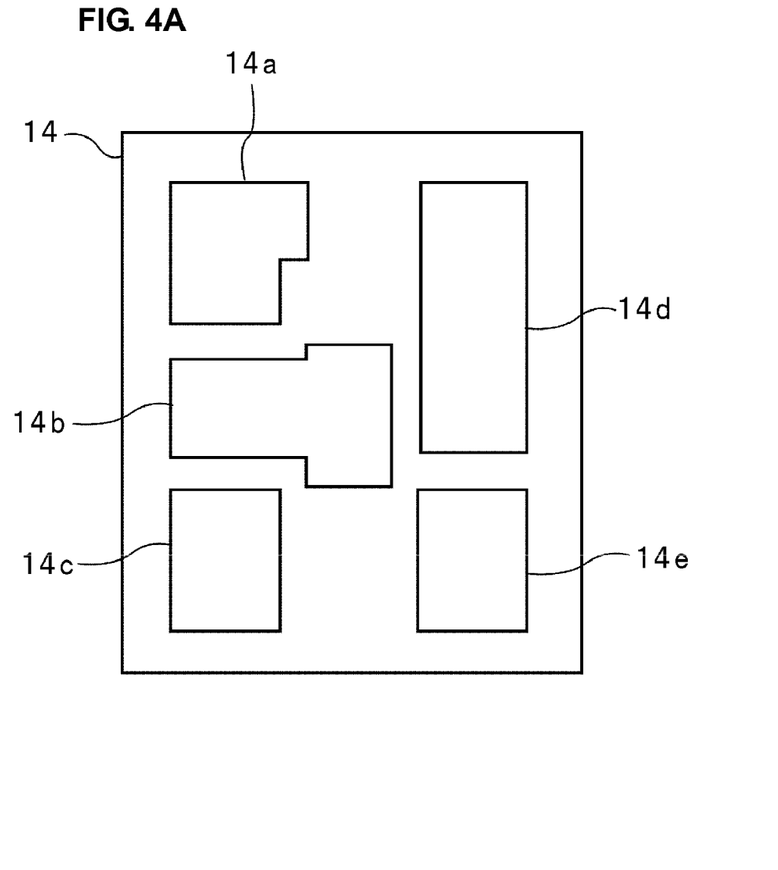
FIG. 4A is a plan view of a package substrate used in the surface acoustic wave filter device in the preferred embodiment illustrated in FIG. 1.
Figure 4B:
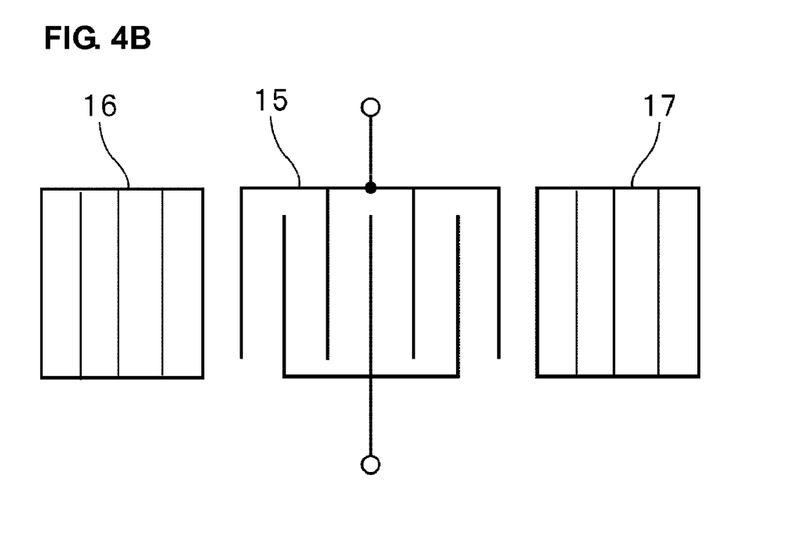
FIG. 4B is a schematic plan view illustrating an electrode structure of a surface acoustic wave resonator.

An electrode structure of an IDT electrode and reflectors defining an acoustic wave resonator is schematically illustrated in FIG. 4B. As illustrated in FIG. 4B, an IDT electrode 15 includes several electrode fingers interdigitated with each other. Reflectors 16 and 17 are arranged at opposite sides of the IDT electrode 15.

Referring back to FIG. 3, the acoustic wave resonator S1a is connected to an electrode land 12a at the input terminal side through a wiring pattern. A bump 13a is attached on the lower surface of the electrode land 12a. The bump 13a is provided to electrically connect to an electrode land 14a on the package substrate 14 which will be described below. One end of the acoustic wave resonators S1a and P32 are commonly connected and electrically connected to the electrode land 12b through the wiring pattern.

An end of the acoustic wave resonator P32 which is at the opposite side to the end connected to the electrode land 12b is connected to an electrode land 12c through the wiring pattern. The electrode land 12c is an electrode land to be connected to a ground potential.

Another end of the acoustic wave resonator P33 is electrically connected to an electrode land 12d. The electrode land 12d is an electrode land to be connected to the ground potential.

One end of the acoustic wave resonator P33 and the acoustic wave resonator S1b are commonly connected and connected to an electrode land 12e through the wiring pattern.

An end of the acoustic wave resonator S1b which is at the opposite side to the end connected to the electrode land 12e is connected to an electrode land 12f through the wiring pattern. The electrode land 12f is electrically connected to the output terminal via the first inductor L1b.

On the electrode lands 12a to 12f, bumps 13a to 13f are connected, respectively.

As illustrated in FIG. 4A, electrode lands 14a to 14e are provided on the package substrate 14. The electrode land 14d is connected to the electrode lands 12c and 12d via the bumps 13c and 13d. The electrode lands 14b, 14c, and 14e are connected to the electrode lands 12b, 12c, and 12f via the bumps 13d, 13c, and 13f, respectively. The electrode land 14a is the electrode land to be connected to the input terminal via the first inductor L1a, and the electrode land 14e is the electrode land to be connected to the output terminal via the first inductor L1b. The electrode land 14d is the only electrode land that is connected to the ground potential. Each of the electrode lands 14b and 14c defines a terminal to be connected to the inductor L2.

Specifically, as illustrated in FIG. 5A, the first inductors L1a and L1b and the second inductor L2 are defined by a chip-type inductance component which is independent of the package substrate 14. The inductor L1a and the inductor L1b are electrically connected to the electrode land 14a and the electrode land 14e of the package substrate 14, respectively, and the inductor L2 is electrically connected between the electrode lands 14b and 14c.

In this configuration, as illustrated in FIG. 5B, the surface acoustic wave filter chip 11 includes the single piezoelectric substrate 12 and is mounted on the electrode lands on the package substrate 14 through the bumps by bump bonding. However, according to preferred embodiments of the present invention, the inductors may be defined by inductance elements other than a chip-type inductance component.

Figure 10A:
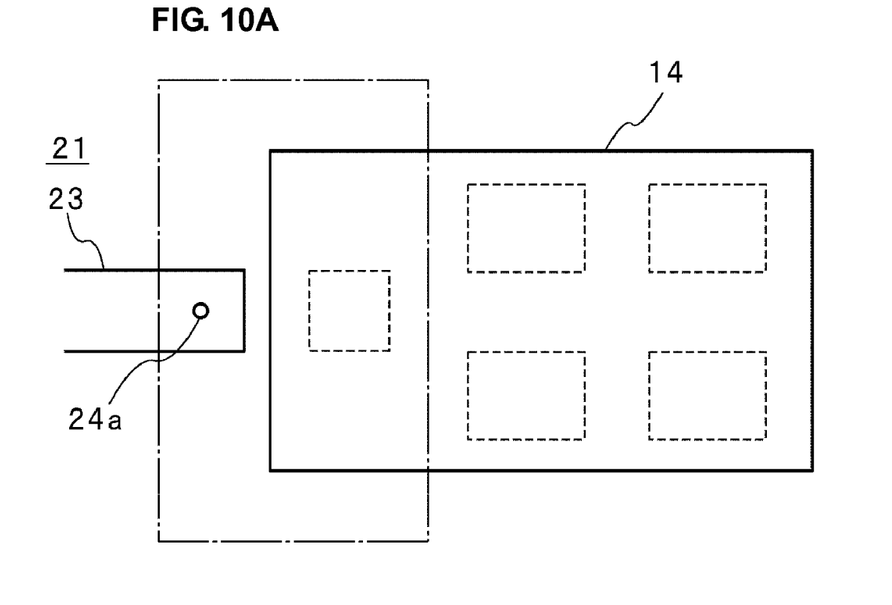
FIG. 10A is a partial fragmentary plan view illustrating the relationship between a package substrate and a mounting substrate in a modified example of the present invention.
Figure 10B:
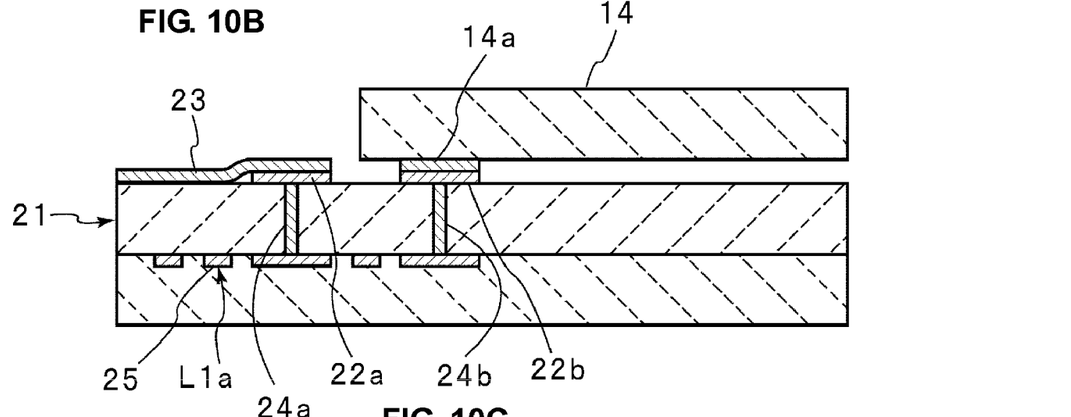
FIG. 10B is a partial fragmentary elevational cross-sectional view for describing built-in inductance elements disposed in the mounting substrate illustrated in FIG. 10A.
Figure 10C:
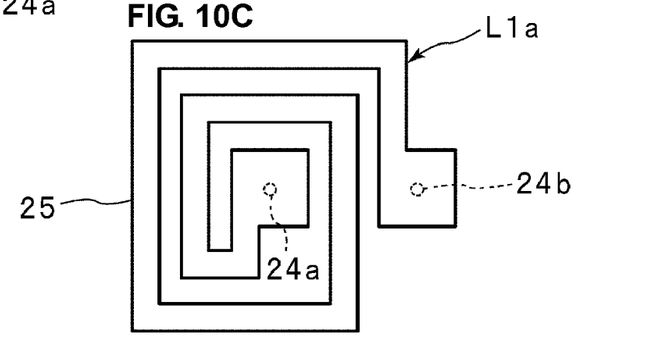
FIG. 10C is a schematic plan view for describing a pattern of built-in inductors.

FIGS. 10A to 10C are a schematic plan views for describing a modified example in which an inductor is built in a mounting substrate, a fragmentary elevational cross-sectional view, and a schematic plan view illustrating an example of an inductance.

As illustrated in FIG. 10A, in the modified example, a surface acoustic wave filter chip (not shown) is mounted on the package substrate 14 by bump bonding, similarly to the above-described example. The package substrate 14 is mounted on a mounting substrate 21 defined by a multi-layer substrate. The above-described first and second inductors L1a, L1b, and L2 are built in the mounting substrate 21. In this example, a portion in which the first inductor L1a is disposed will be described as a representative example.

As illustrated in FIGS. 10A and 10B, the mounting substrate 21 includes electrode lands 22a and 22b on its upper surface. The electrode land 22a is electrically connected to a terminal electrode 23 disposed on the mounting substrate 21. The terminal electrode 23 defines an input terminal. The electrode 22b is electrically connected to the electrode land 14a connected to an input terminal provided in the package substrate 14.

The electrode lands 22a and 22b are connected to throughhole electrodes 24a and 24b, respectively. The through-hole electrodes 24a and 24b extend to an intermediate-height location in the mounting substrate 21 and are connected to a coil pattern 25 defining the first inductor L1a disposed at an intermediate-height location. As illustrated in FIG. 10C, the coil pattern 25 preferably has a winding pattern shape so as to have a plurality of turns on the mounting substrate 21. One end of the coil pattern 25 is connected to the through-hole electrode 24a, and the other end of the coil pattern 25 is connected to the through-hole electrode 24b. In this manner, the first inductor L1a is built in the mounting substrate 21. The second inductor L2 and the other first inductor L1b are similarly built in the mounting substrate 1.

Accordingly, the number of parts is reduced and further downsizing of the surface acoustic wave filter device can be achieved by building the inductors in the mounting board.

As is apparent from the above-described preferred embodiment and the modified example, the first and second inductors may be defined by a chip-type inductance component or inductors built in a mounting board. Further, in the above-described preferred embodiment, the surface acoustic wave filter chip 11 configured using the piezoelectric substrate 12 is mounted on the substrate through the bumps by a face bonding technique. However, the surface acoustic wave filter chip may also be bonded to the electrode lands on the package substrate through bonding wires.

In the above-described preferred embodiment, the first and second acoustic wave resonators preferably are defined by surface acoustic wave resonators. However, they may be defined by boundary acoustic wave resonators.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device having a first attenuation band, a pass band having a first center frequency, the pass band located on a frequency side that is lower than the first attenuation band, and a second attenuation band located on a frequency side that is higher than the first attenuation band, the acoustic wave filter device comprising:

first filter circuit portions having first inductors provided in a series arm that couples an input terminal and an output terminal and first acoustic wave resonators serially connected to the first inductors; and a second filter circuit portion having at least one second inductor provided in the series arm, a second acoustic wave resonator connected between one end of the second inductor and a ground potential, and a third acoustic wave resonator connected between the other end of the second inductor and the ground potential; wherein the first filter circuit portions and the second filter circuit portion are serially connected in the series arm; and when the center frequency of a frequency characteristic of an LC filter defined by capacitance components of the first, second and third acoustic wave resonators and inductance components of the first and second inductors is a second center frequency, the second center frequency is higher than the first center frequency.

2. The acoustic wave filter device according to claim 1, wherein the first filter circuit portions are connected to both of the input side and output side of the second filter circuit portion.

3. The acoustic wave filter device according to claim 1, wherein a plurality of second inductors are provided in the second filter circuit portion, and the second acoustic wave resonator connected to one end of one of the second inductors and a third acoustic wave resonator connected to the other end of the other one of the second inductors are included between the adjacent second inductors.

4. The acoustic wave filter device according to claim 1, wherein the second center frequency is located at the high end of the pass band.

5. The acoustic wave filter device according to claim 1, wherein an anti-resonant frequency of the first acoustic wave resonators and a resonant frequency of the second acoustic wave resonator are different from each other.

6. The acoustic wave filter device according to claim 1, wherein each of the first and second inductors is defined by a chip-type inductance component.

7. The acoustic wave filter device according to claim 1, further comprising an acoustic wave filter chip including a single piezoelectric substrate having the first, second and third acoustic wave resonators provided thereon and a mounting substrate having the acoustic wave filter chip mounted thereon, wherein the first and second inductors are built in the mounting substrate.

* * * * *